(12) United States Patent
Farole et al.

(10) Patent No.: US 7,987,594 B1
(45) Date of Patent: Aug. 2, 2011

(54) METHOD OF MANUFACTURING AN INTERCONNECTED FOIL CONTACT ARRAY

(75) Inventors: Dominic Anthony Farole, Hummelstown, PA (US); Keith Edwin Miller, Manheim, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 794 days.

(21) Appl. No.: 11/934,191

(22) Filed: Nov. 2, 2007

Related U.S. Application Data

(60) Provisional application No. 60/864,818, filed on Nov. 8, 2006.

(51) Int. Cl.
*H01R 43/00* (2006.01)
(52) U.S. Cl. ............... 29/884; 29/861; 439/74; 439/511
(58) Field of Classification Search .................... 29/831, 29/857, 861, 866, 874, 876, 882, 884; 174/117 F; 439/67, 74, 248, 260, 496, 507, 511
See application file for complete search history.

(56) References Cited

U.S. PATENT DOCUMENTS

| | | | | |
|---|---|---|---|---|
| 3,696,319 | A * | 10/1972 | Olsson | 439/496 |
| 3,923,364 | A * | 12/1975 | Shapiro et al. | 439/496 |
| 4,902,236 | A * | 2/1990 | Hasircoglu | 439/67 |
| 5,099,392 | A | 3/1992 | Miller et al. | |
| 5,145,381 | A | 9/1992 | Volz | |
| 5,639,260 | A * | 6/1997 | McHugh | 439/260 |
| 5,928,003 | A | 7/1999 | Kajinuma | |
| 6,302,704 | B1 | 10/2001 | Belanger, Jr. | |
| 7,059,893 | B2 | 6/2006 | Ono et al. | |
| 7,410,364 | B2 | 8/2008 | Kishi et al. | |
| 2005/0268911 | A1 | 12/2005 | Cross et al. | |

\* cited by examiner

*Primary Examiner* — Donghai D. Nguyen

(57) ABSTRACT

A method of manufacturing an array of thin metallic foil strips of predetermined thickness, the strips assembled to form circuits that can be electrically connected to a printed circuit board, cables or attached to wires. The strips are assembled to a base using contacts. A first side of the strips are assembled to a first side of the base. The foil strips are draped over a mandrel and a second side of the strips are assembled to a second side of the base. The excess material is removed from the strip to form a plurality of strips that form independent circuits when assembled to the circuit board.

19 Claims, 6 Drawing Sheets

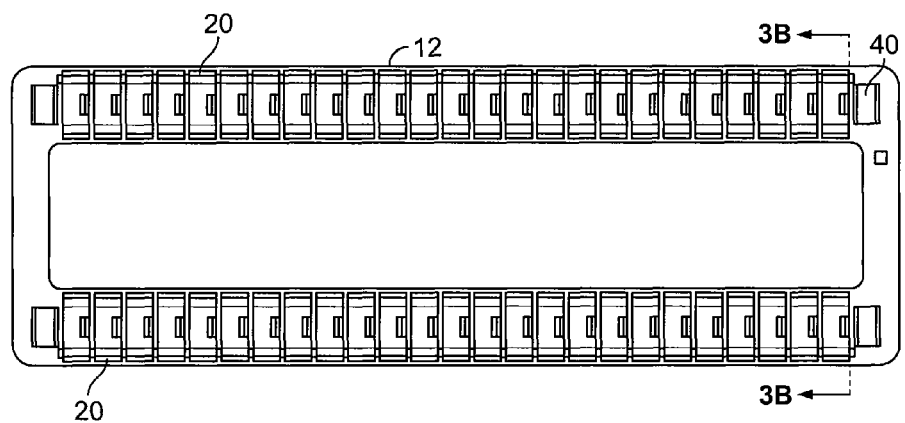
FIG. 3A
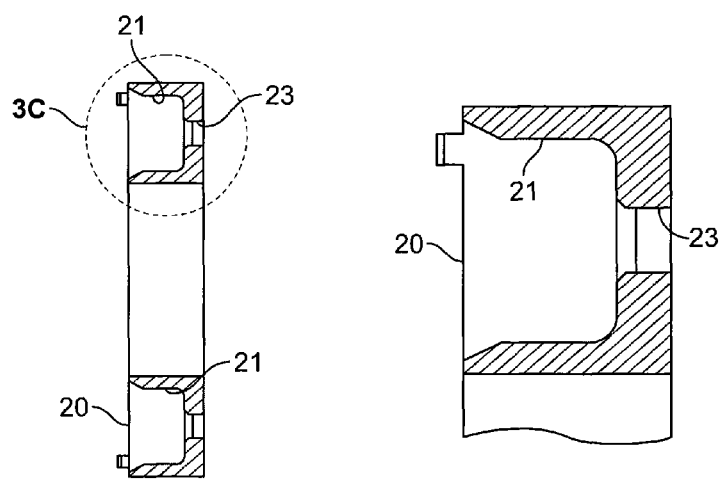
FIG. 3B  FIG. 3C

METHOD OF MANUFACTURING AN INTERCONNECTED FOIL CONTACT ARRAY

This application is related to application Ser. No. 11/934,165 (Farole et al.), now U.S. Pat. No. 7,537,463, entitled MECHANICALLY INTERCONNECTED FOIL CONTACT ARRAY AND METHOD OF MANUFACTURING, filed on even date with the present application and assigned to the assignee of this application.

FIELD OF THE INVENTION

The present invention is directed to a method of manufacturing a thin flexible circuit that can be used to control an operation.

BACKGROUND OF THE INVENTION

Microchip devices have been used for a wide variety of applications. However, these devices have not included thin metal foils. Simple problems faced in utilizing these thin foils in microchip devices include incorporating the foils onto the PCBs or microchips, as they are susceptible to tearing simply from handling the foils. More complex problems include assembling the foils to other components of the microchip devices so as to establish a sound electrical contact. Methods are required to establish this contact between the foil and the associated devices, as well as applying normal forces to the foil without damaging it so as to retain it in position once the contact is established. Since the thin metal foils in microchip devices will carry electrical current, the method of assembly should also remove barriers to a sound electrical connection by cleaning the surface of the foils of oxides without damaging, tearing or puncturing the foil. Additional problems can arise in assembling the microchips that include the foil onto components.

Before thin metal foils can be used reliably as production items for microchips, methods to reliably assemble these foils onto PCBs and PCBs onto components must be found. Uses for such thin foils in or on microchips are limited because of these problems, but should expand once solutions to these problems are presented.

SUMMARY OF THE INVENTION

The present invention is a method for assembly of an array of metallic foil strips of predetermined thickness to a printed circuit board, cables or wires. A reliable electrical connection is formed between components of a circuit board or the cables and wires and the array of metallic foil strips. An associated power source, on the printed circuit board, or attached to the circuit board, cables or wires, provides an electrical current to or through one or more preselected strips in the array of foil strips. The current may be directed by components on the PCB or by a controller. Depending upon the use of the circuit board, the foil strips can be used to start or to end an operation.

The selection of the foil strip is determined by the electrical properties of the metal such as its resistivity as well as the thickness and width of the foil strips to provide a strip with characteristics required to achieve a preselected result. As an electric current is provided by a power source, it passes through contacts connected to the one or more foil strips. The application of current through the metallic material can be used to achieve a number of results. For example, the current can cause the temperature of one or more foil strips to increase, due to the resistivity of the selected metal, causing the foil to act as a heating element.

There are a number of factors that can be varied to achieve a preselected foil temperature. Certainly, one of the factors is the resistivity of the metallic material selected. The thickness of the foil as well as the width of the metallic material in a strip can also affect the foil temperature. Of course, the current supplied also affects the foil temperature. Thus, by careful selection of the metallic material, foil thickness, foil width and foil length and current supplied, the effective temperature of the foil, and a control device, which may conveniently be included on a printed circuit board (PCB), the metal foil an be used as a variable heating element to carefully control the temperature within a confined space.

The methods of the present invention must establish a reliable, permanent electrical connection between the foil array and the component, whether the component is an element on a PCB foil, a wire or a cable. The present invention accomplishes this assembly by draping the foil array over a mandrel. The method further involves connecting the foil array to a first set of contacts, and while maintaining the foil array draped over the mandrel, connecting the foil array to a second set of contacts. While the foil array can be connected to first set of contacts and a second set of contacts on a single PCB, the method is not so limited, as the method can be used to connect the foil array between a set of contacts on a first PCB and a set of contacts on a second PCB. Alternatively, the invention can be used to connect the foil array between a set of contacts on a PCB and at least one wire, or to connect the foil array between a first group of wires and a second group of wires.

An advantage of the present invention is that the invention enables the assembly of the thin arrays of foil to a PCB while establishing a reliable contact at either end of the foil without damaging the fragile foil. The assembly of the thin arrays to the foil to the PCB complete the circuit on the PCB or between the PCB and other components.

Another advantage of the present invention is that the foil can be used as a coated substrate and assembled to a PCB without damaging the coating, the substrate being protected from exposure to an environment until a predetermined temperature is achieved, thereby liberating a coating material on the substrate and exposing the substrate.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 3 depicts the housing from at top view, in cross-section and a blow-up of an aperture.

DETAILED DESCRIPTION OF THE INVENTION

Figure 1:
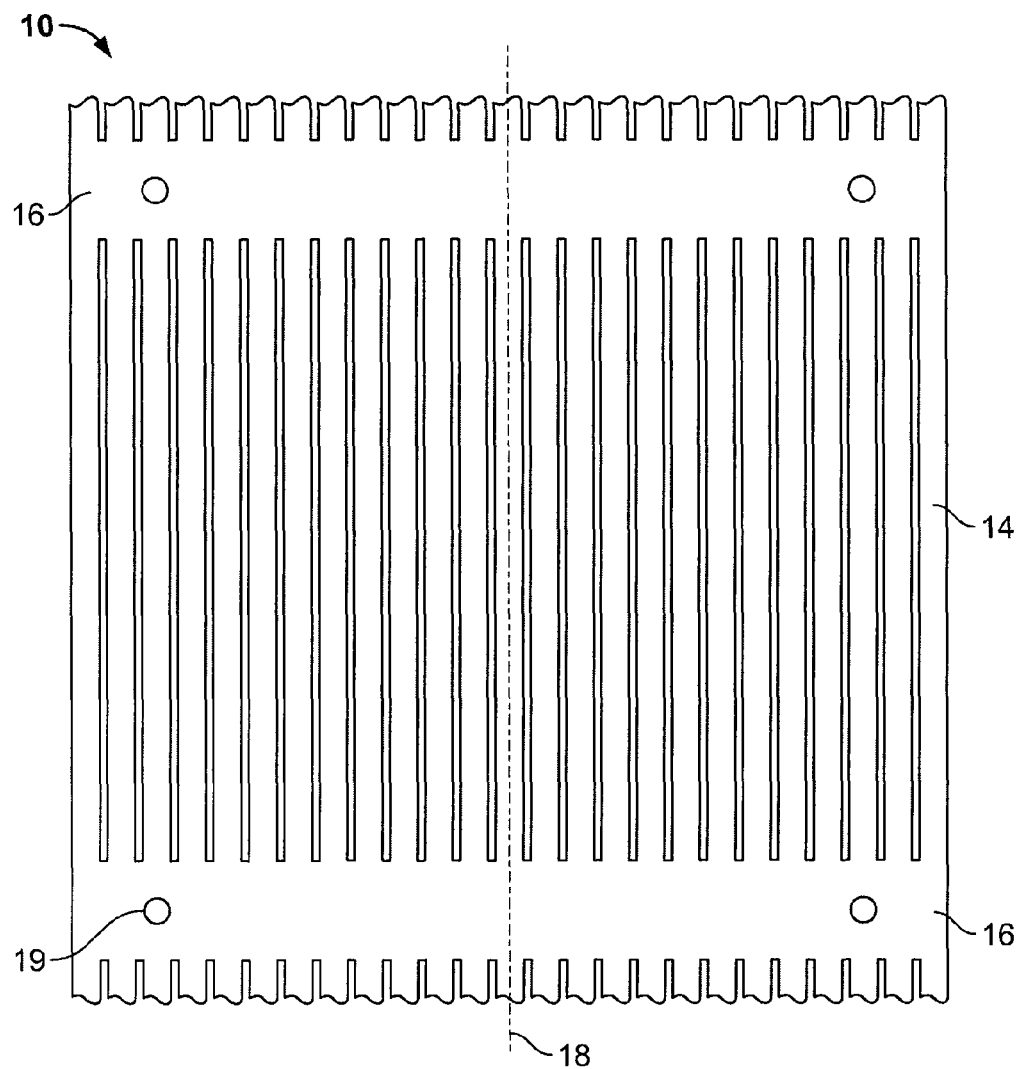
FIG. 1 is a perspective view of a foil array of the present invention.
Figure 2:
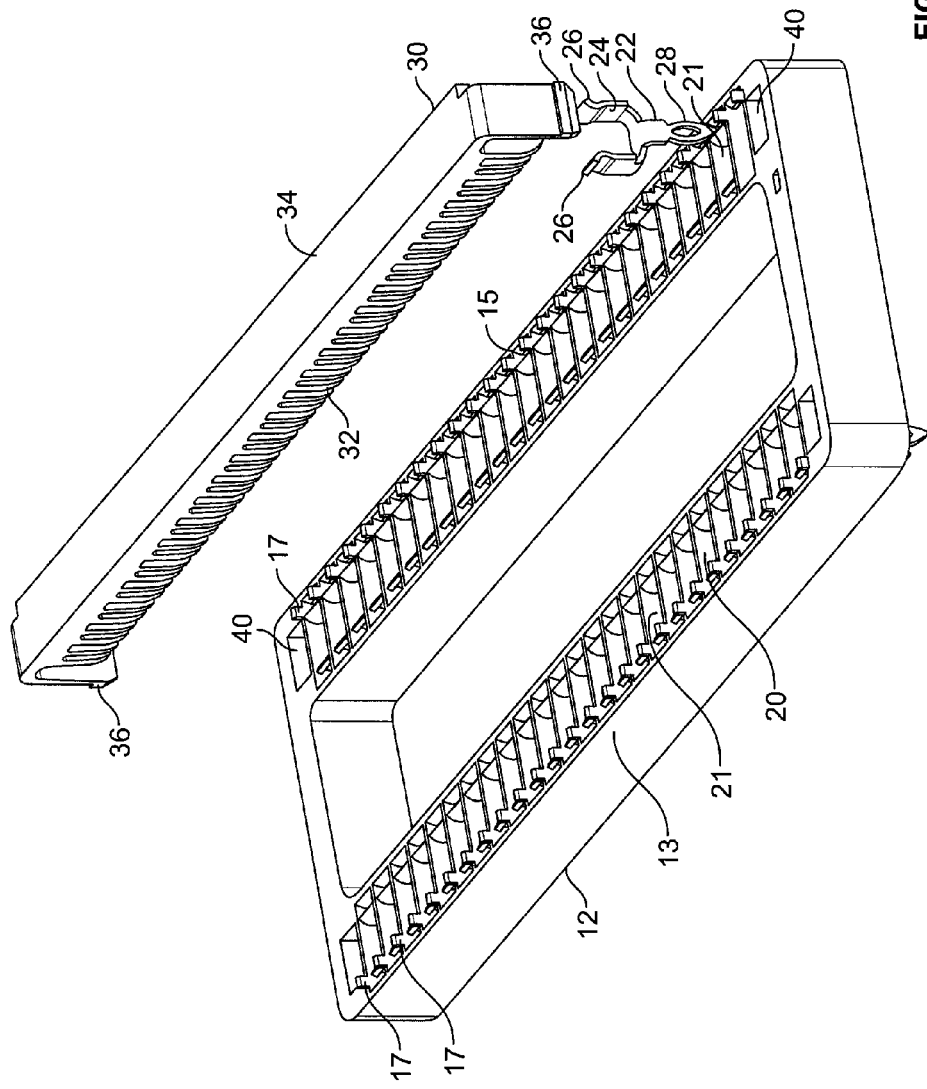
FIG. 2 is an exploded view of the housing having apertures, a contact adjacent to one of the apertures and a beam of the present invention.

The present invention provides a thin metallic foil as an array of strips electrically connected to a power supply that provides an electrical current through the metallic foil. As used herein, a thin metallic foil means a metallic foil having a thickness of 0.005 inches and thinner, while an ultra-thin metallic foil means a metallic foil having a thickness of 0.0005 and thinner. Preferably, the thin metallic foil is connected to a printed circuit board (PCB) that either includes the power supply or is connected to the power supply. Preferably the foil connections are mechanical in nature, although the foil also can function when connected metallurgically, such as by soldering. A foil array 10 is depicted in FIG. 1. An exploded view of a housing 12, a contact 22 and a beam 30 are shown in FIG. 2. Housing includes a plurality of apertures 20. Contacts 22 are assembled into apertures 20. Depending on the system design, it is not necessary that a contact 22 be assembled into every aperture. However, in order to complete a circuit, it is necessary for a contact to be assembled onto corresponding apertures on opposed sides 13, 15 of housing 12.

The housing is depicted in FIG. 3. FIG. 3A depicts a top view of the housing 12, while FIG. 3B depicts a cross section of the housing 12, while FIG. 3C depicts a detailed view of a housing aperture 20. The housing 12 includes a plurality of apertures 20. A contact 22 is assembled into apertures 20 on opposed sides 13, 15 of housing 12, the spacing of the assembled contacts 22 corresponding to the spacing of the strips in the foil array 10.

Referring to FIGS. 2 and 3, each contact 22 includes an upper U-shaped portion 24 having a pair of arms 26 connected to a lower leg 28. The upper U-shaped portion 24 of each contact is sized to reside in the upper portion 21 of aperture 20. The upper portion 21 of aperture 20 is preferably slightly wider than the upper U-shaped portion 24 of contact 22. Similarly, the lower portion 23 of aperture 20 is slightly wider than the lower leg 28 of contact 22. This allows contacts 22 to float within the housing 12 thereby allowing forces to reach equilibrium. The lower leg 28 of each contact 22 extends through housing 12, allowing the assembly to be connected to form a circuit by establishing a connection between the strips 14 at one end and the legs 28 at the other. The lower legs 28 extending through the housing is clearly depicted in FIG. 4. The foil array 10 assembled to a housing 12 having contacts 22 utilizing a beam 30 constitutes an assembly. While FIG. 2 illustrates a preferred geometry for contact 22, other contact configurations that establish a reliable connection between the contact 22 and a strip of the foil array to establish a circuit through the assembly are also contemplated by the invention.

In accordance with the present invention, a foil array 10 is cut into a predetermined pattern. The predetermined pattern will depend upon the ultimate use of the foil array. A typical foil array pattern is depicted in FIG. 1. The foil array is cut from a thin strip of metal. The metal may include any material, but typically is a conductive material selected from the group consisting of copper and its alloys, aluminum and its alloys, tin and its alloys, nickel and its alloys and silver and its alloys. The metal strip may be coated with a conductive coating either before or after being cut or formed into an array by any convenient coating method. Typical coatings include gold, platinum, silver, palladium and rhodium. FIG. 1 depicts a pattern for a metal foil array 10 having a plurality of strips 14, each strip being substantially identical to an adjacent strip and typically separated from adjacent strips by the same distance. However, in different applications, the pattern may differ form the one shown in FIG. 1, depending on the application. The width of adjacent strips may differ, the distance between the strips can be different, the length of the strips may be different and even the thickness of the strips at different locations on the foil can be different. For example, not only can the strip thickness be modified by modifying foil thickness, but by carefully masking the foils, coatings can be applied to different strips to change the thickness or change the conductivity of selected strips as desired. Strips can even be removed from preselected positions, such as by cutting.

As depicted in FIG. 1, the foil array 10 includes a plurality of strips 14, depicted here as being substantially planar and substantially parallel to one another. The foil array may be a thin foil or an ultra-thin foil, depending upon the application. As the foils become progressively thinner, they become more difficult to handle, with ultra-thin foils being more prone to damage than thin foils. A band 16 substantially perpendicular to the plurality of strips 14 extends the length of the foil array on each side of the foil array. The foil array 10 depicted in FIG. 1 is symmetrical about a centerline 18, although it will be understood that symmetry about a centerline is not required. The foil array further includes tooling holes 19 in the bands 16 to further facilitate handling of the foil array 10.

A housing 12 and at least one beam 30, preferably a pair of beams, are provided to capture the foil array. The housing includes a plurality of apertures 20 as depicted in FIG. 2, extending through the thickness of the housing. Each aperture 20 includes an upper portion 21 and a lower portion 23 as depicted in FIG. 3. Contacts 22 are assembled into the apertures 20. As depicted in FIG. 2, the contacts 20 have a pair of arms 26 extending in a U-shaped configuration, although other configurations may be used, such as a V-shape, and a lower leg 28 that extends through the lower portion of aperture 23. The contacts are conductive material, typically made from one of the materials used for the foil, described above. Also as can be seen in FIG. 2, the apertures extend on either side of the housing. Contacts 22 are placed in apertures 20 on either side of the housing 12, thereby comprising a housing subassembly, although contacts are not required to be placed in every aperture of the housing. Contacts are placed in apertures 20 only if a circuit is to be completed across the opposed sides 13, 15 of housing 12, as will be evident and float in the housing 12. The housing also include a second, or latch aperture 40. As depicted in FIG. 2, four latch apertures 40 are depicted. In FIG. 2, the latch apertures are shown at the corners of the housing 12, although there is no requirement to limit the number or placement of the latch apertures 40.

Figure 4:
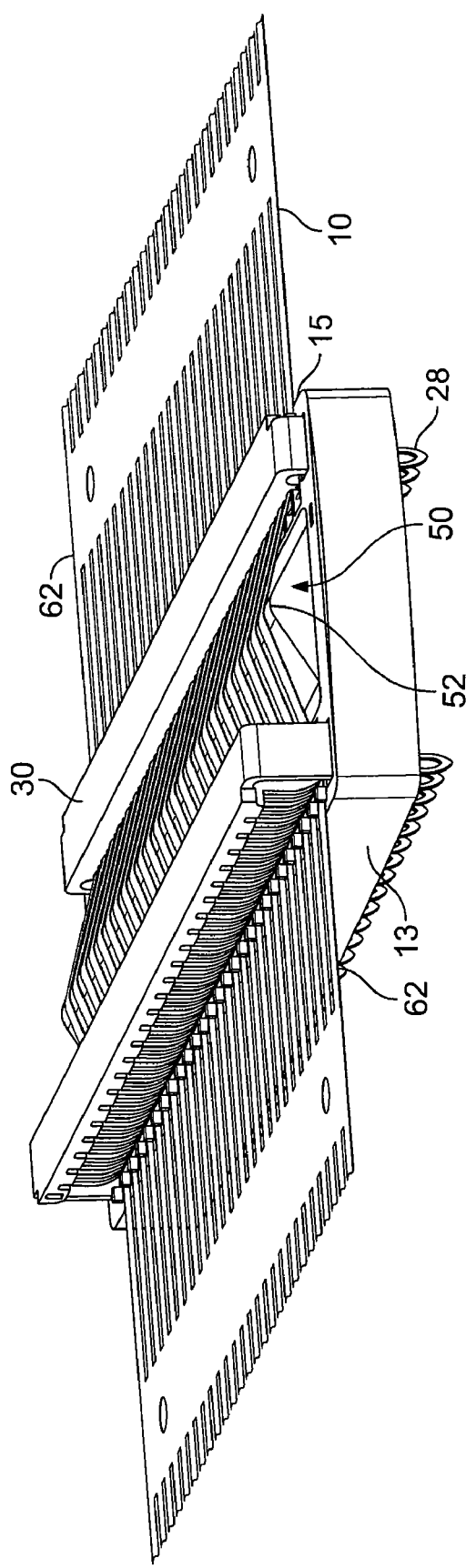
FIG. 4 is a perspective view of the foil assembly of the present invention being assembled to the housing.

Housing 12 also includes a plurality of guide ribs 17 that are used for foil alignment. After a housing subassembly is prepared and provided, a foil array is assembled to it. Although this is most efficiently done using an automated process, it can be done by hand. The next step in the process is to place the foil array 10 over the housing as shown in FIG. 4. A first beam 30 is then provided. Each beam has a plurality of fingers 32 extending downward from a beam top surface 34. The beam is aligned over the housing 12 and foil array 10 so that the fingers 32 are aligned over the apertures 20. The beam 30 is lowered, toward the apertures 20 on one side of the housing 12. A beam finger 32 forces a strip of the plurality of strips 14 comprising the foil array down between the arms 26 of contact 22, capturing the strip between the arms 26. As the finger enters the arms 26, there is sufficient space in aperture 20 to allow the spring-like arms 26 to deflect. As the fingers 32 enter the arms 26, the arms deflect, but exert a force on the fingers 32 to capture the strip and finger therebetween, establishing a firm mechanical, and consequently electrical, contact between the captured strip and the contact 22.

Referring back to FIG. 2, beam 30 also includes a latch 36 that corresponds to latch aperture 40. It will be appreciated that, while latch 36 in beam 30 corresponds to latch aperture 40 in housing 12, these male and female elements can be reversed to provide a latch device. In fact, any other method of latching beam 30 to housing 12 so as to capture the beam to the housing, thereby further capturing the strip between arms 26 of contact 22, may be used. Latch 36 serves as a guidance system for the beam 30 as it enters latch aperture 40 during assembly into the housing.

The next step in the process is depicted in FIG. 4. A mandrel 50 is brought into contact with the foil array. The foil array, strips of which are captured in the contacts 22 on one side of the housing 12 as described above, are draped over the mandrel 50. Mandrel 50 is a small surface area mandrel. The mandrel has a smooth rounded surface 52, but the surface area that contacts the foil is sufficiently small so as not to form a point that could damage the foil. It is, however, preferred to minimize the contact between the mandrel 50 and the foil array 10. The mandrel controls the length of the strips extending across opposed sides 13, 15 of housing 12 and exerts sufficient force on the foil array 10 to deflect the strips upward, placing them in tension on assembly. The size of the mandrel 50 will vary depending on the length and width of the foil array 10 between bands 16. Clearly, the radius at the point at which the mandrel contacts the foil strips should not be so sharp as to pierce or penetrate the foil. However, the mandrel should not contact so much of the foil as to apply too great of a tensile force on the foil array during assembly so as to tear or penetrate the foil array. In a preferred embodiment, the mandrel should be sized to contact about 50% or less of each strip of the plurality of strips between apertures on either side of the housing as the assembly proceeds. Preferably, the mandrel should be sized to contact about 25% or less of each strip of the plurality of strips between apertures on either side of the housing as the assembly proceeds. Most preferably, the mandrel should be sized to contact about 10% or less of each strip of the plurality of strips between apertures on either side of the housing as the assembly proceeds.

The mandrel 50 is provided to support the foil array 10 during assembly and contacts the plurality of strips, preferably from the underside, that is, on the side opposite of the beam top surface 34 as shown in FIG. 4. The mandrel is not precluded from contacting the foil array from the other side, provided that the assembled foil array does not extend below the housing at the completion of assembly operations. After the assembly of foil array 10 into the contacts 22 on a first side 15 of housing 12 using a beam 30, thereby trapping the foil array 10 on the first side 15 of housing 12, the foil array is draped over a small area mandrel 50 and maintained in contact with the mandrel 50 as the free end of the foil array 10 is identically assembled into the opposite side of the housing 12. The plurality of strips are placed over apertures 20 on opposed side of housing 15. A second beam 30 urges the foil into the upper arms 26 of contact 22, so that the strips of foil are captured between the beam and contact 22, the downward force of the fingers exerting a force on the strips, drawing them taut and away from the arcuate, sloped sides of mandrel 50. At this point the plurality of strips 10 are in tension, which is evident since the plurality of strips is taut. After beam 30 is assembled to side 13 of housing 12, the mandrel can be removed. Upon removal of the mandrel 50, the tensile stresses are removed, but a compressive stress remains in the plurality of strips. Once beams 30 are inserted into the apertures, each of the fingers 32 applies a normal force to the portion of each strip 14 of the plurality of strips that it contacts, urging it downward and into the upper U-shaped portion 24 of contact 22, slightly deflecting the arms 26 of contact 22 outwardly within the aperture 20 toward the walls of the housing 12. This is possible as the upper portion 21 of aperture 20 is slightly larger than the U-shaped portion 24 of the contact 22. Each thin foil strip is self-centered in the U-shaped portion 24 of contact 22, and thus captured in each aperture 20 having a contact 22 by the upper U-shaped portion 24 between the arms 26 and the finger 32, the finger 32 exerting a force on the both the arms 26, placing the arms in tension and a normal force on the foil strip 24 adequate to break any oxides on the metal foil. A two-point contact between the foil strip 14 and the contact 22 is established by this arrangement. As discussed above, second beam 30 also includes a latch feature to retain the beam and contacts in housing 12.

Figure 5:
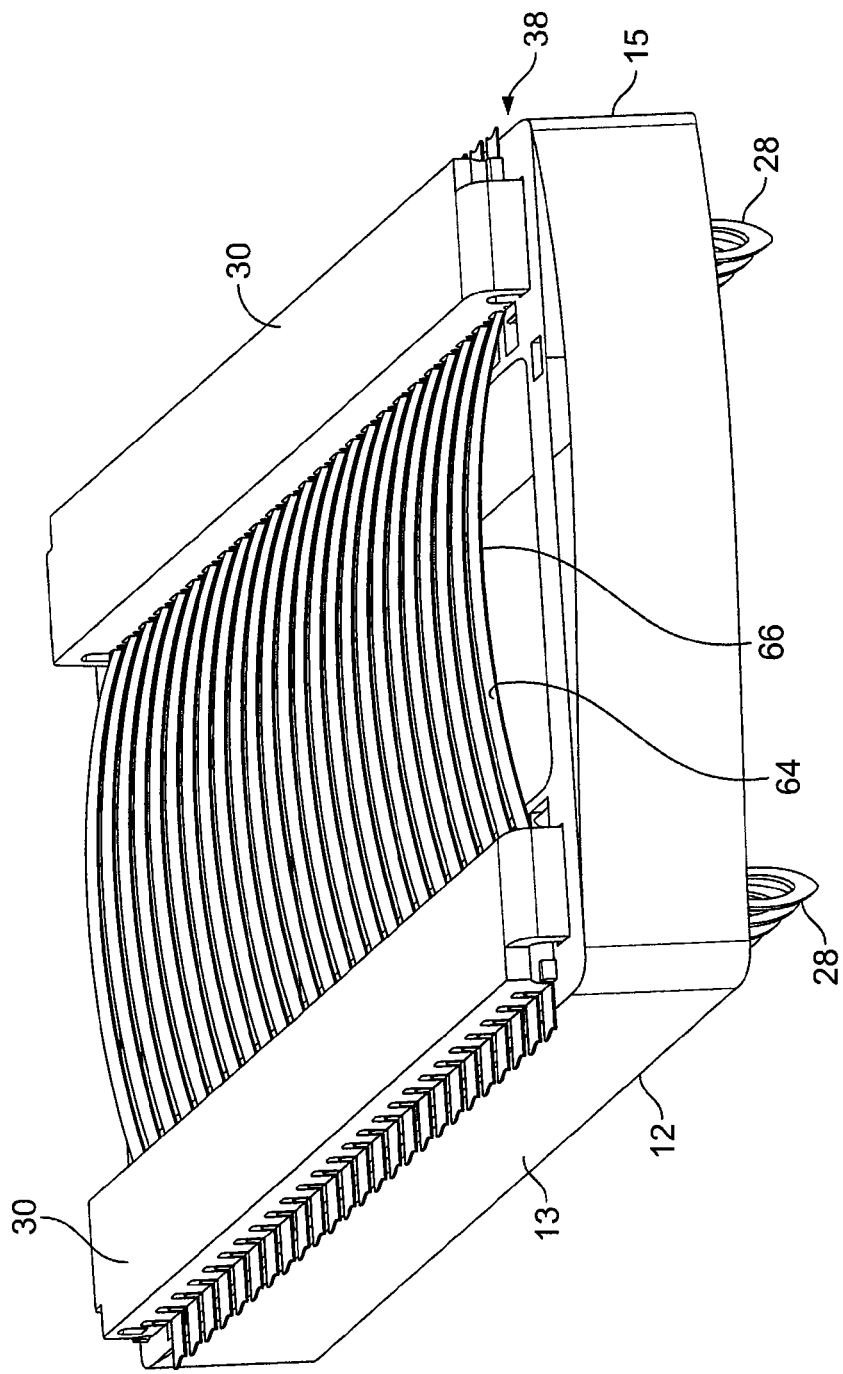
FIG. 5 depicts a completed assembly, the foil array assembled to the base with excess foil trimmed and ready for installation onto a PCB.
Figure 6:
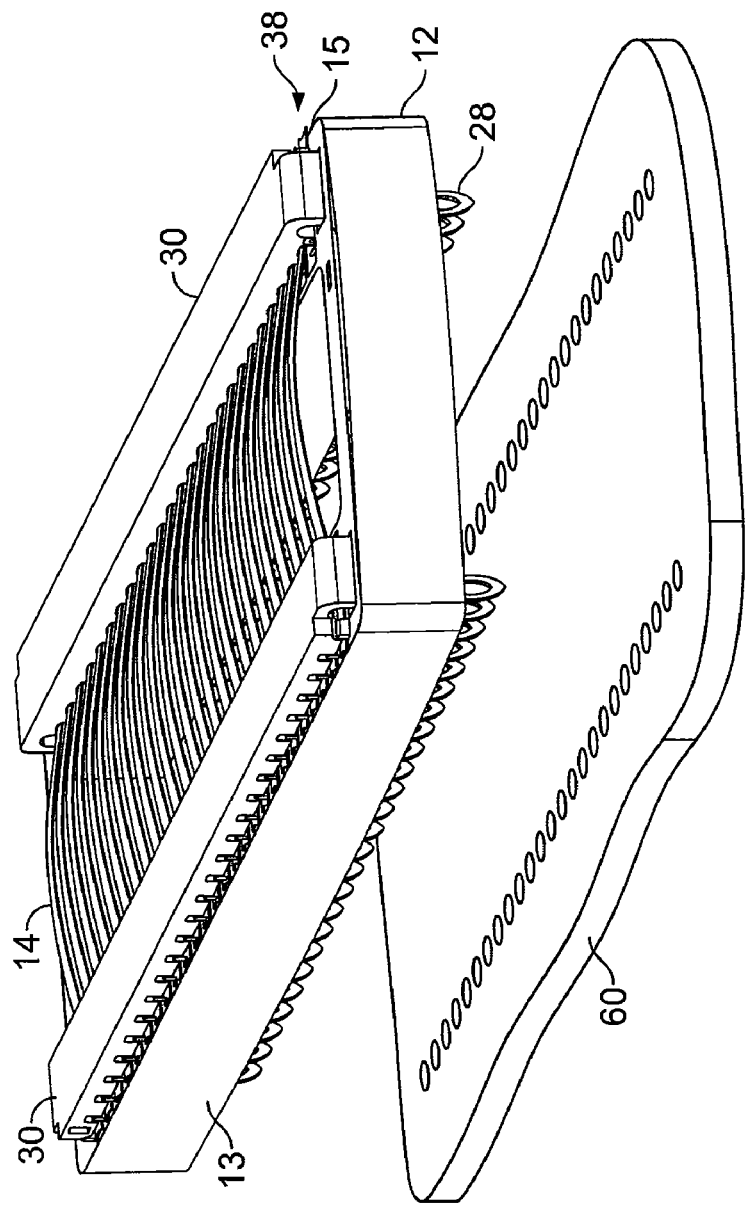
FIG. 6 is a schematic depicting the assembly being assembled to a printed circuit board.

With the plurality of strips 14 captured in apertures 20 on either side 13, of the housing, the foil material 62 extending outwardly beyond the housing is removed by any convenient method. Preferably, a trimming tool can be used to remove the excess foil in a single operation. The assembly 38 is depicted in FIG. 5. A circuit exists running from the lower leg 28 of contact 22 extending below housing 12. The plurality of strips form an arch 64, the strips relaxing to a compressive state on removal of the mandrel. The strips thus do not form a plane across the sides of housing 13, 15, but rather form an arch that extends slightly above a plane that would include the top surface of the housing 12. Preferably, the apex of the arch formed by each strip is a point, such that these points formed by the apex of each strip form substantially a straight line. As used herein, the term "form substantially a straight line" is governed by good manufacturing practice. The circuit runs through the contact, across strip 66 to the contact on opposed side of housing 13 to the lower leg 28. A plurality of separate circuits are thus provided. Clearly, if no strip is provided in the foil array at a position across opposed contacts on the housing, no circuit is available at this position. Alternatively, if contacts are omitted in apertures on one or both sides of the housing, again no circuit is available. Thus it is possible to tailor the final assembly to a predetermined configuration, if desired. This can be particularly useful if a circuit is not desired or required across each and every pair of apertures. Assembly 38 can readily be mated, as shown in FIG. 6, to a PCB having pin apertures configured to receive the lower legs 28 of contacts 22 extending beyond housing 12, which legs 28 function as pins, the circuitry on the PCB and the final assembly completing the circuit(s). The force required to insert the contacts or pins into the PCB is transferred directly through beam 30 into the contacts until the contacts are in their final downward position. A simple flat tool can be used without distorting either the contacts or the foils. Because each contact is in a condition that allows it to float, the tool engaging the beam, and the beam engaging the contacts allows the contacts to be pushed into the PCB, without the contacts being dislodged from the assembly. This simplifies assembly.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for manufacturing a foil contact assembly having a plurality of circuits, comprising the steps of:
   providing a housing having an upper surface and a lower surface, the housing further having substantially opposed first and second sides, each side of a pair of opposed sides including a plurality of apertures having an upper portion and a lower portion, the apertures on each side of the pair of opposed sides corresponding substantially to apertures on the opposed side;

providing a plurality of contacts, each contact having an upper portion and a lower portion;

inserting the plurality of contacts into the apertures from the upper surface to the lower surface on opposed sides of the housing so that the upper portion of each contact is positioned in the upper portion of the aperture, while the lower portion of the contact extends through the lower portion of the aperture, a portion of the lower portion of each contact extending through the housing opposite the upper portion of the contact;

providing a metallic foil having a plurality of strips of predetermined thickness, providing a first beam, the beam having a plurality of fingers extending from a beam surface, the beam further including a latch mechanism;

placing the foil between the first beam and the housing so that a strip of the plurality of strips extend across apertures on at least the first side of the housing;

capturing the foil in the contacts by inserting the plurality of fingers of the first beam into the apertures so that the fingers are captured within the upper portion of the contacts on the first side of the housing and electrically connecting the plurality of strips to the plurality of contacts on the first side;

providing a mandrel;

providing a second first beam, the beam having a plurality of fingers extending from a beam surface, the beam further including a latch mechanism;

positioning the metallic foil so that each strip of the plurality of strips extend over apertures on the second side of the housing;

while maintaining the mandrel in contact with the foil, inserting the second beam so that the plurality of fingers capture the foil in the contacts by inserting the plurality of fingers of the second beam into the apertures on the second side of the housing wherein the fingers are captured within the upper portion of the contacts on the second side of the housing and electrically connecting the plurality of strips to the plurality of contacts on the second side; and;

removing the mandrel from contact with the strips of metallic foil.

2. The method of claim 1 wherein the housing further includes a latch device corresponding to the latch mechanism on the first and second beam, the method further including latching the latch devices of the housing with the latch mechanism on the first and second beam, thereby guiding each beam into the housing and locking the first beam and the second beam to the housing.

3. The method of claim 1 further including the step of removing the mandrel from contact with the strips of metallic foil after the step of inserting the plurality of fingers of the second beam into the apertures on the second side of the housing.

4. The method of claim 1 further including a step of removing excess foil extending beyond the housing wherein the removing excess foil provides a plurality of independent connections extending from each contact of the plurality of contacts on the first side of the housing, through each strip of a plurality of strips to each contact of the plurality of contacts on the second side of a housing, each contact on the first side of the housing corresponding to a contact on the second side of the housing.

5. The method of claim 3 further including the step of providing a printed circuit board, the printed circuit board having a plurality of pin apertures, and inserting the lower portion of the contacts extending through the housing into plurality of pin apertures on the printed circuit board.

6. The method of claim 1 wherein the step of providing a plurality of contacts includes providing a plurality of contacts having a U-shaped upper portion.

7. The method of claim 1 wherein the step of providing a plurality of contacts includes providing a plurality of contacts having a V-shaped upper portion.

8. The method of claim 1 wherein the step of providing metallic foil further includes providing a foil at least a portion of which is coated with a coating.

9. The method of claim 8 wherein the step of providing metallic foil, at least a portion of which is coated includes providing a non-conductive coating on the portion which is coated.

10. The method of claim 8 wherein the step of providing metallic foil, at least a portion of which is coated includes providing a conductive coating selected from the group consisting of copper, copper alloys, aluminum, aluminum alloys, gold, gold alloys, tin, tin alloys, silver, silver alloys, platinum alloys, nickel, nickel alloys, chromium, chromium alloys, palladium, palladium alloys and wherein the conductive coating is a different material than the metallic foil.

11. The method of claim 1 wherein the step of providing a metallic foil includes providing a metallic foil selected from the group consisting of copper, copper alloys, aluminum, aluminum alloys, gold, gold alloys, tin, tin alloys, silver and silver alloys.

12. The method of claim 1 wherein the step of providing a plurality of contacts includes providing a plurality of contacts comprising a conductive material.

13. The method of claim 1 wherein the step of providing a metallic foil having a plurality of strips of predetermined thickness includes providing thin strips having a thickness of 0.005 inches and less.

14. The method of claim 1 wherein the step of providing a metallic foil having a plurality of strips of predetermined thickness includes providing ultra-thin strips having a thickness of 0.0005 inches and less.

15. A method for manufacturing a foil contact assembly having a plurality of circuits, comprising the steps of:

providing a housing having an upper surface and a lower surface, the housing further having substantially opposed first and second sides, each side of a pair of opposed sides including a plurality of apertures having an upper portion and a lower portion, the apertures on each side of the pair of opposed sides corresponding substantially to apertures on the opposed side;

providing a plurality of contacts, each contact having an upper portion and a lower portion;

inserting the plurality of contacts into the apertures from the upper surface to the lower surface on opposed sides of the housing so that the upper portion of each contact is positioned in the upper portion of the aperture, while the lower portion of the contact extends through the lower portion of the aperture, a portion of the lower portion of each contact extending through the housing opposite the upper portion of the contact;

providing a foil having a plurality of strips of predetermined thickness, providing a first beam, the beam having a plurality of fingers extending from a beam surface, the beam further including a latch mechanism;

placing the foil between the first beam and the housing so that a strip of the plurality of strips extend across apertures on at least the first side of the housing;

capturing the foil in the contacts by inserting the plurality of fingers of the first beam into the apertures so that the fingers are captured within the upper portion of the contacts on the first side of the housing and electrically connecting the plurality of strips to the plurality of contacts on the first side;

providing a mandrel;

providing a second first beam, the beam having a plurality of fingers extending from a beam surface, the beam further including a latch mechanism;

positioning the foil so that each strip of the plurality of strips extend over apertures on the second side of the housing;

while maintaining the mandrel in contact with the foil, inserting the second beam so that the plurality of fingers capture the foil in the contacts by inserting the plurality of fingers of the second beam into the apertures on the second side of the housing wherein the fingers are captured within the upper portion of the contacts on the second side of the housing and electrically connecting the plurality of strips to the plurality of contacts on the second side; and;

removing the mandrel from contact with the strips of foil.

16. The method of claim 15 wherein the step of providing a foil includes providing a conductive foil.

17. The method of claim 15 wherein the step of providing a foil includes providing a coated foil wherein the coating is a conductive material and the foil is a coatable dielectric material.

18. The method of claim 17 wherein the coating is selected from the group consisting of copper, copper alloys, aluminum, aluminum alloys, gold, gold alloys, tin, tin alloys, silver, silver alloys, platinum alloys, nickel, nickel alloys, chromium, chromium alloys, palladium, and palladium alloys.

19. The method of claim 15 wherein the step of contacting the mandrel with the foil further includes contacting the foil array with a mandrel that applies a tensile force to the foil array without penetrating the foil array.

\* \* \* \* \*